US007550921B2

(12) United States Patent
Kim

(10) Patent No.: US 7,550,921 B2
(45) Date of Patent: Jun. 23, 2009

(54) PLASMA DISPLAY PANEL ASSEMBLY

(75) Inventor: Doo-Young Kim, Seoul (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 868 days.

(21) Appl. No.: 10/934,722

(22) Filed: Sep. 7, 2004

(65) Prior Publication Data

US 2005/0067956 A1 Mar. 31, 2005

(30) Foreign Application Priority Data

Sep. 25, 2003 (KR) ..................... 10-2003-0066500

(51) Int. Cl.
*H01J 17/49* (2006.01)
*H05K 5/00* (2006.01)

(52) U.S. Cl. ........................ 313/582; 313/587; 361/681

(58) Field of Classification Search ......... 313/582-587, 313/46; 361/681, 688, 800, 816, 831
See application file for complete search history.

(56) References Cited

U.S. PATENT DOCUMENTS 3,706,899 A * 12/1972 Galves et al. ............... 313/586
3,778,126 A * 12/1973 Wilson ........................ 445/25
3,778,127 A * 12/1973 Langston et al. .............. 445/25
5,207,607 A * 5/1993 Nagano et al. ................ 445/25
6,114,804 A * 9/2000 Kawase et al. .............. 313/495
6,400,074 B1 * 6/2002 Yamaura et al. ............ 313/495
6,831,401 B1 * 12/2004 Yamamoto et al. .......... 313/495
6,831,402 B2 * 12/2004 Kamiguchi ................. 313/495
6,848,964 B1 * 2/2005 Sasaki et al. .................. 445/25
6,984,159 B1 * 1/2006 Kado et al. ..................... 445/6
2002/0063514 A1 * 5/2002 Oishi et al. ................. 313/495
2002/0153840 A1 * 10/2002 Isohata et al. ............... 313/582
2003/0025443 A1 * 2/2003 Kamiguchi ................. 313/495
2003/0141796 A1 * 7/2003 Kamiguchi ................. 313/281
2003/0230381 A1 * 12/2003 Watanabe ................... 156/250
2005/0099124 A1 * 5/2005 Chen et al. .................. 313/582

FOREIGN PATENT DOCUMENTS

KR 2000-0001763 1/2000

OTHER PUBLICATIONS

English language translation of Korean Patent Publication No. 20-2000-0001763 published on Jan. 25, 2000.

* cited by examiner

*Primary Examiner*—Joseph L Williams
*Assistant Examiner*—Bumsuk Won
(74) *Attorney, Agent, or Firm*—Robert E. Bushnell, Esq.

(57) ABSTRACT

A plasma display panel (PDP) has an exhaust pipe protruding from a panel assembly, a chassis base mounted on one side of the panel assembly to support the panel assembly such that the exhaust pipe protrudes through a hole formed in the chassis base. A reinforcement structure is mounted on the chassis base to fortify the chassis base and to prevent torque and bending of the panel assembly. A protection structure is designed to form a space to enclose the exhaust pipe to prevent damage to the exhaust pipe. The protection structure is formed to be integral with the reinforcement structure.

21 Claims, 4 Drawing Sheets

PLASMA DISPLAY PANEL ASSEMBLY

CLAIM OF PRIORITY

This application makes reference to, incorporates the same herein, and claims all benefits accruing under 35 U.S.C. §119 from an application for PLASMA DISPLAY PANEL ASSEMBLY earlier filed in the Korean Intellectual Property Office on Sep. 25, 2003 and there duly assigned Serial No. 2003-66500.

BACKGROUND OF THE INVENTION

1. Field of the Invention

The present invention relates to a plasma display panel assembly, and more particularly, to a plasma display panel that is easy to manufacture due to a simple structure that protects an exhaust pipe formed on a substrate.

2. Description of the Related Art

Generally, a plasma display panel (PDP) assembly is a flat display device in which a plurality of electrodes are formed opposite to a plurality of substrates, and a predetermined voltage is applied across an electric discharge area between the substrates that is injected with an electric discharge gas so that an image is formed by light emitted by ultraviolet rays generated at the discharge area.

The PDP assembly is manufactured by combining together a front panel and a rear panel after producing the front and rear panels separately. A chassis base is installed on the back of the combined panels, and a circuit substrate is mounted on the chassis base that makes possible mutual transmission of electric signals between the panel assembly and the circuit substrate. Then the resultant structure is installed inside a case after carrying out a predetermined testing process.

Air that exists between the panels of conventional PDP assemblies has to be discharged to the outside when combining the front and rear panels together. To do this, the air that is inside is discharged through a predetermined location of the panel when the panel is in a soft state. When the panel hardens after the air has been discharged, an air exhaust pipe hardens and protrudes outward. The exhaust pipe is a part of the panel, but because the exhaust pipe protrudes outward, the exhaust pipe is susceptible to being broken.

FIG. 1 is a cross-section of a shroud device 10 of a PDP exhaust port disclosed in Korean Patent Laid-open Publication No. 2000-1763. Referring to FIG. 1, the shroud device 10 includes an exhaust port 12 formed on a glass substrate 11. A first shroud area 13 made of a soft material covers the exhaust port 12 and adheres to the glass substrate 11. A second shroud area 16 encloses an exhaust port shroud region 100 and has an adhesive wing 14 that is adhered to the glass substrate 11 by a double-sided tape 15. A back plate 17 is formed on top of the glass substrate 11. The back plate 17 has an aperture through which the second shroud area 16 is exposed.

The conventional shroud device 10 of the exhaust port is manufactured as follows. First, the exhaust port 12 is formed at a predetermined location on the glass substrate 11 and is covered by the first shroud area 13 made of a soft material like rubber, and the bottom of the first shroud area 13 is fixed to the glass substrate 11. Next, using the double-sided adhesive tape 15 adhered to the bottom of the adhesive wing 14 of the second shroud area 16, the second shroud area 16 is adhered to the glass substrate 11 to cover the exhaust port 12 and the first shroud area 13. The second shroud area 16 may be made of a rigid material such as a metal or PVC synthetic resin. After adhering the first shroud area 13 and the second shroud area 16 to the glass substrate 11, the back plate 17, which protects the glass substrate 11, is mounted on top of the glass substrate 11.

FIG. 2 is a perspective view of the second shroud area 16 of shroud device 10 of FIG. 1. Referring to FIG. 2, the second shroud area 16 has a shroud region 100 with a large enough volume to accommodate the exhaust port 12 and the first shroud area 13. A cylindrical body 110 has a predetermined length depending on the size of the shroud region 100 and has one closed end and one open end. The adhesive wing 14 has an annular shape, and is formed along the circumference of the open end of the cylindrical body 110 as a single body. The double-sided tape 15 is adhered along the circumference of the adhesive wing 14.

However, the conventional shroud device for an exhaust pipe has the complex manufacturing process described above. Also, because separate first and second shroud areas have to be provided and installed on the portion where the exhaust pipe is formed, there is an increase in the production costs.

On the other hand, a reinforcement member is becoming more necessary to prevent the glass substrate from bending or twisting in a horizontal or vertical direction as the PDP assemblies become larger and the size of the glass substrate became larger. A method of installing a structure for protecting the exhaust pipe on such a reinforcement member must be considered.

SUMMARY OF THE INVENTION

It is therefore an object of the present invention to provide an improved structure for a PDP.

It is also an object to provide a design for a PDP that both protects the exhaust pipe and is easy and inexpensive to manufacture.

It is further an object of the present invention to provide a PDP assembly with a simplified structure and includes a reinforcement member and a structure of protecting an exhaust pipe as a single body adhered to a chassis base mounted on the back of a panel with the reinforcement member.

These and other objects may be achieved with a PDP assembly that includes a panel assembly with a protruded exhaust pipe, a chassis base supporting the panel assembly, a reinforcement structure mounted on the chassis base and fortifying the strength of the chassis base toward the panel assembly and a protection structure sheltering an end of the exhaust pipe and formed as a single body with the reinforcement structure. The reinforcement structure is disposed behind the chassis base and is adhered to at least one of a top, a bottom, a left side, and a right side of the chassis base horizontally or vertically. The exhaust pipe protrudes toward the reinforcement structure by passing through a hole formed in the chassis base.

According to another aspect of the present invention, there is provided a PDP assembly which includes an exhaust pipe protruded from a panel assembly, a chassis base mounted on one side of the panel assembly to support the panel assembly such that the exhaust pipe protrudes through a hole formed in the chassis base, a reinforcement structure mounted on at least one of a top, a bottom, a left side, and a right side of the chassis base behind the chassis base to fortify the chassis base, and a protection structure formed as a single body with the reinforcement structure and enclosing a space accommodating an end of the exhaust pipe, the protection structure being formed at an end of the reinforcement structure that is located where the exhaust pipe is placed.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
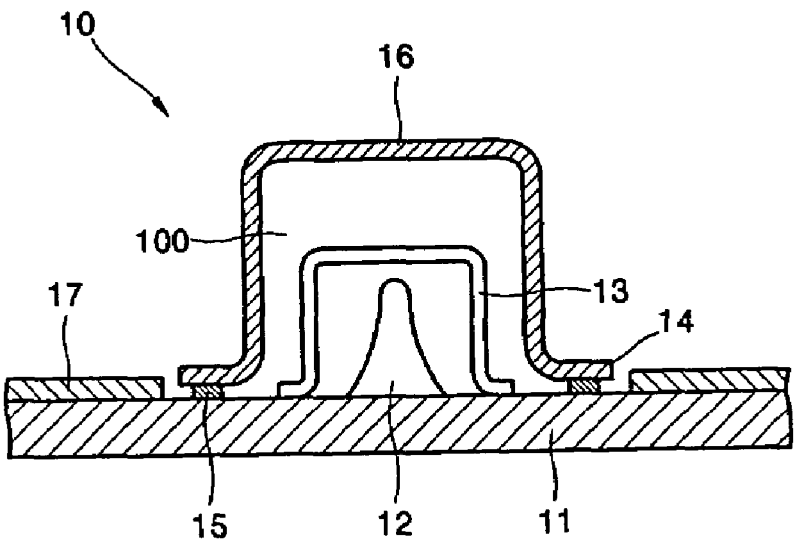
FIG. 1 (PRIOR ART)
FIG. 1 is a cross-section of a shroud device of an exhaust port of a conventional plasma display panel (PDP) assembly.
Figure 2:
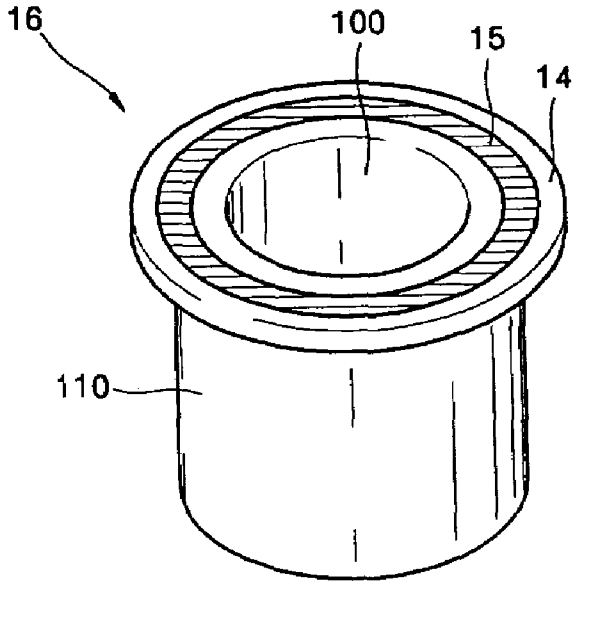
FIG. 2 (PRIOR ART)
FIG. 2 is a perspective view of a shroud area of FIG. 1.
Figure 3:
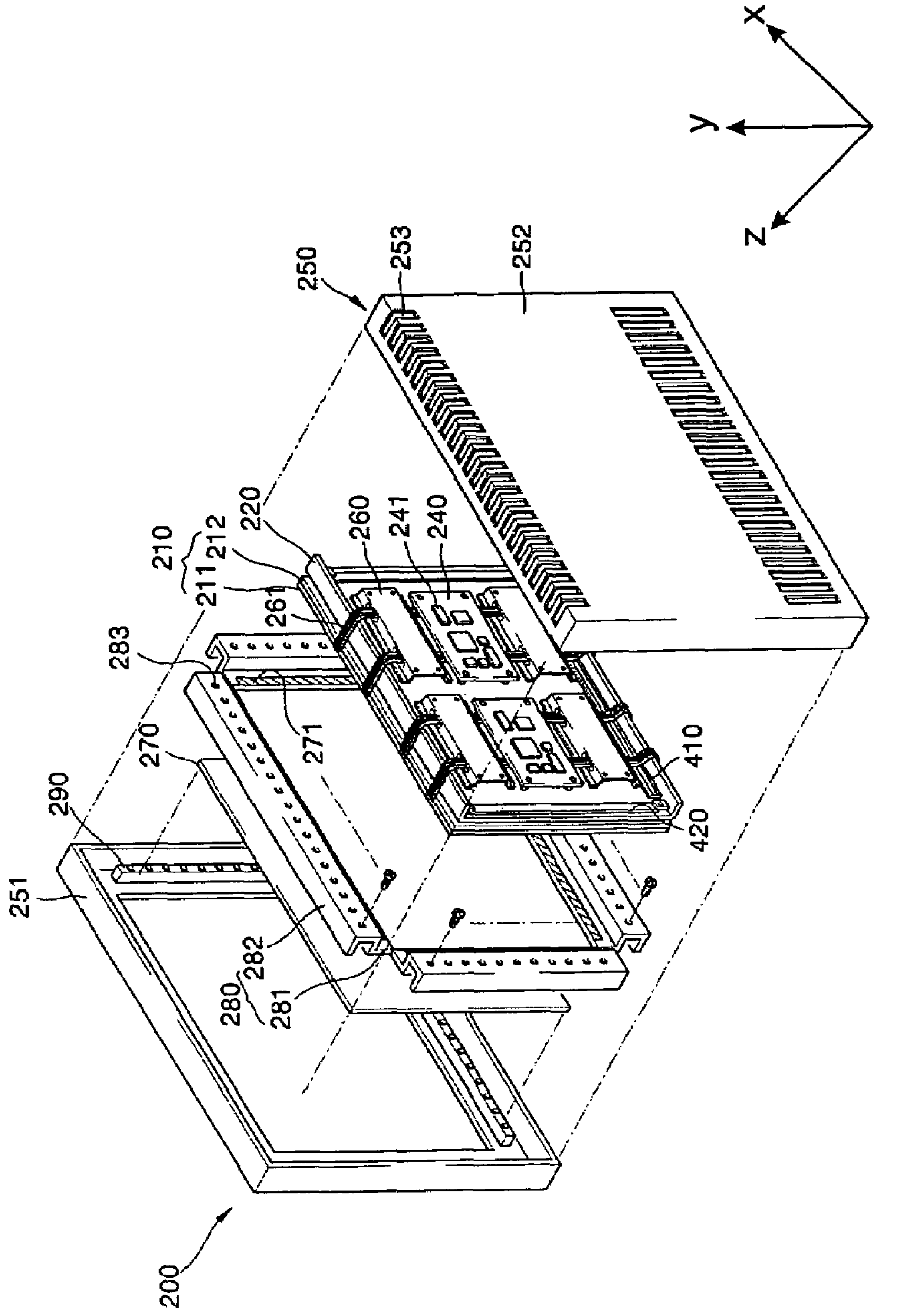
FIG. 3 is an exploded perspective view of a PDP assembly according to an embodiment of the present invention.

Turning now to FIG. 3, FIG. 3 is an exploded perspective view of a PDP assembly 200 according to an embodiment of the present invention. Referring to FIG. 3, a PDP assembly 200 includes a panel assembly 210, a chassis base 220 arranged substantially parallel to the panel assembly 210, a heat conduction medium 230 (refer to FIG. 4) interposed between the panel assembly 210 and the chassis base 220 and adhering the chassis base 220 to the panel assembly 210, a driving circuit unit 240 installed on the back of the chassis base 220 and electrically connected by the panel assembly 210 to drive the panel assembly 210, a filter assembly 270 installed at the front of the panel assembly 210, and a case 250 accommodating the panel assembly 210, the chassis base 220, the driving circuit unit 240 and the filter assembly 270.

The panel assembly 210 includes a front panel 211 and a rear panel 212 that is combined with the front panel 211. The front panel 211 includes an X electrode, a Y electrode, a bus electrode electrically connected to the X and Y electrodes, a front dielectric layer covering the X and Y electrodes and the bus electrode, and a protective layer coated on the front dielectric layer. The rear panel 212 is installed opposite to the front panel 211 and includes an address electrode, a rear dielectric layer covering the address electrode, a barrier rib limiting an electric discharge area and preventing cross-talk, and a phosphor layer including red, green, and blue regions spread inside the barrier rib.

The chassis base 220 installed at the back of the rear panel 212 of panel assembly 210 is required to not only support the panel assembly 210 but to also dissipate heat by uniformly dispersing the high heat produced by the panel assembly 210. To do so, the chassis base 220 is made of an aluminium alloy, which has good heat conductivity and is also rigid The heat conduction medium 230 is made of a heat dissipating sheet so that the heat produced by the panel assembly 210 can be dissipated efficiently to the chassis base 220.

The driving circuit unit 240 is installed at the back of the chassis base 220. A plurality of electrical parts 241 are mounted on the driving circuit unit 240. Furthermore, a chassis member 260 can be installed on the chassis base 220. A flexible printed cable 261 is attached to the chassis member 260. A lead on chip (LOC) is installed in the flexible printed cable 261, and the flexible printed cable 261 is connected to each electrode terminal of the panel assembly 210 allowing the driving circuit unit 240 to transmit electric signals to the panel assembly 210.

A filter assembly 270 is installed at the front of the front panel 211 of panel assembly 210. The filter assembly 270 is adhered to the front of the front panel 211 by an adhesive member 271. The filter assembly 270 blocks electromagnetic waves, infrared rays, and neon radiation produced by the panel assembly 210, and reflects external light.

The case 250 is made out of a front cabinet 251 mounted on the front of the filter assembly 270 and a back cover 252 installed at the back of the chassis base 220 with the driving circuit unit 240. A plurality of vent holes 253 are formed in top and bottom portions of the back cover 252.

A filter holder 280 is installed on the back of the filter assembly 270. The filter holder 280 includes a pressing unit 281 that presses the filter assembly 270 toward the front cabinet 251, and a fixing unit 282 bent in a U-shape, protruding toward the front panel 211. A plurality of coupling holes 283 are formed on the fixing unit 282.

A filter installation unit 290 is mounted on the back of the front cabinet 251. The fixing unit 282 aligns with the filter installation unit 290, and the filter assembly 270 is fixed to the front cabinet 251 by screws.

According to the feature of the present invention, the PDP assembly 200 includes at least one reinforcement structure installed on the chassis base 220 as such reinforcement becomes necessary when the panel assembly 210 is very large in size. Such reinforcement structure includes a protection structure made of a single body with the reinforcement structure to protect the exhaust pipe formed on the panel assembly 210 during the production process.

Figure 4:
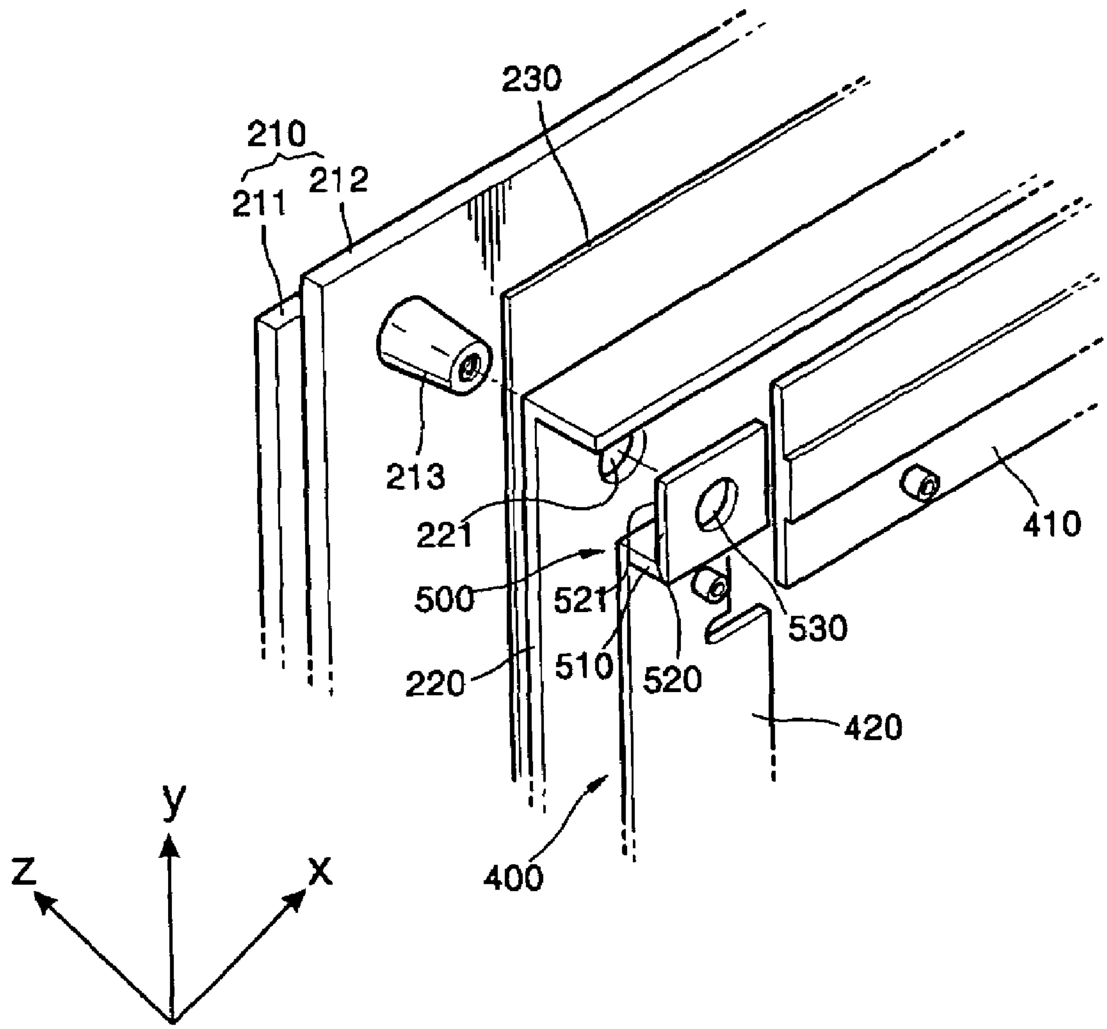
FIG. 4 is an exploded perspective view of a protecting structure of an exhaust pipe of the PDP of FIG. 3 according to an embodiment of the present invention.

FIG. 4 is an enlarged view of a reinforcement structure 400 and a protection structure 500 of the PDP assembly 200 of FIG. 3 according to an embodiment of the present invention. Like reference numerals in the previous drawings denote like members.

Referring to FIG. 4, the chassis base 220 is located behind the rear panel 212 with the heat conduction medium 230 located in between. The reinforcement structure 400 is mounted on the back of the chassis base 220 to prevent the chassis base 220 from bending as the size of the panel assembly 210 increases.

The reinforcement structure 400 is mounted on at least one of the upper, middle, and lower portions of the chassis base 220 and extends horizontally in the x-direction. Also, at least one reinforcement structure 400 is mounted on a left and right top end portion or a predetermined distance horizontally inward from a left and right top end portion horizontally.

The reinforcement structure 400 includes a horizontal reinforcement member 410 and a vertical reinforcement member 420 formed at right angles to one another. The locations of the horizontal and vertical reinforcement members 410 and 420 can be changed depending on the structure of the driving circuit 240 and the chassis member 260 mounted on the chassis base 220. The horizontal reinforcement member 410 prevents bending and torque applied horizontally (in the x-direction) to the PDP assembly 200 and the vertical reinforcement member 420 prevents the bending and torque applied vertically (in the y-direction) to the PDP assembly 200. Here, the protection structure 500, which protects an exhaust pipe 213, is formed on the horizontal or vertical reinforcement member 410 or 420 and is formed where the exhaust pipe 213 is located, the description of which is as follows.

The process of manufacturing the panel assembly 210 can be divided into a process of producing the front panel 211, a process of producing the rear panel 212, and a process of combining the front and rear panels 211 and 212 to complete the panel assembly 210. When producing the front panel 211, the X and Y electrodes made of a transparent material are formed on a glass substrate. The bus electrodes electrically connected to the X and Y electrodes are formed. A black stripe layer is formed in a non-discharge area, and a transparent front dielectric layer covering the X and Y electrodes, the bus electrodes, and the black stripe layer is formed. Then the protective layer made of a magnesium oxide is formed on the front dielectric layer.

When producing the rear panel 212, the address electrodes are formed on a glass substrate. Then, a rear dielectric layer that covers the address electrodes is formed and barrier ribs that partition discharge areas are formed. A phosphor layer including red, green, and blue regions is formed inside the barrier ribs and frit is spread to the edges of the glass substrate.

The front and rear panels 211 and 212 are disposed opposite to each other, the area between them is exhausted and injected with a gas and then the front and rear panels 211 and 212 are aged. To exhaust the air from between the front and rear panels 211 and 212 to the outside, the exhaust pipe 213 is formed in the panel assembly 210. The exhaust pipe 213 is formed at a corner of the rear panel 212. The exhaust pipe 213 protrudes in the z-direction a predetermined distance from the surface of the rear panel 212 toward the chassis base 220. Since the exhaust pipe 213 protrudes from the rear panel 212 to the outside, the exhaust pipe 213 must be protected from external pressure.

The protection structure 500 is arranged either horizontally or vertically behind the chassis base 220 and forms a single body with at least one of the horizontal and vertical reinforcement members 410 and 420. Although the protection structure 500 is illustrated in FIGS. 4 and 5 as being located at one end of the vertical reinforcement member 420 in FIG. 4, it is to be appreciated that the protection structure 500 can instead be located at an end of a horizontal reinforcement member 410.

The following description will describe the formation of the protection structure 500 on the vertical reinforcement member 420, as illustrated in FIG. 4. The protection structure 500 is a bent portion of the vertical reinforcement member 420. A first bent portion 510 is bent in a z-direction and perpendicular to the vertical reinforcement member 420 away from the rear panel 212 so that first bent portion 510 extends to a back of PDP assembly 200. Second bent portion 520 is bent in a y-direction from an end of the first bent portion 510 to cover the exhaust pipe 213. Second bent portion 520 is bent in a y-direction to be parallel to vertical reinforcement member 420 but is displaced in a z-direction further to a back of PDP assembly 200 than vertical reinforcement member 420.

Figure 5:
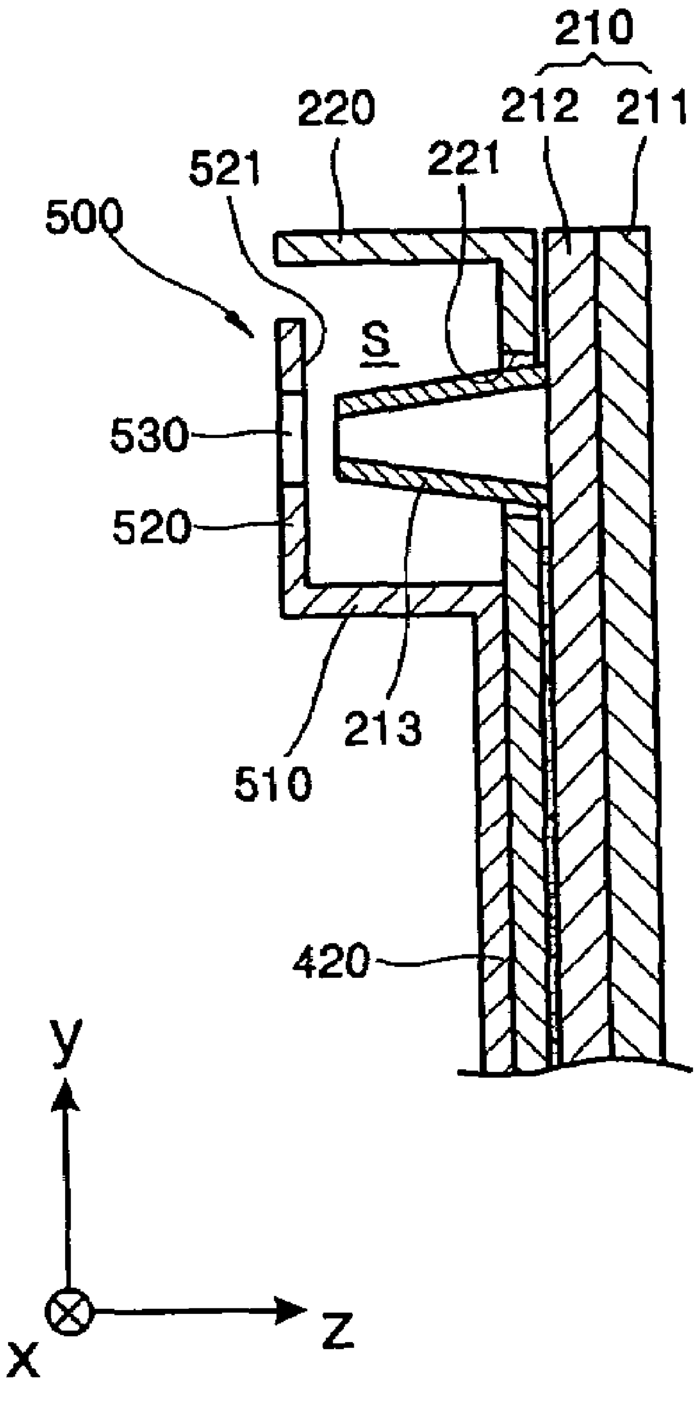
FIG. 5 is a cross-section showing a combined state of the protecting structure of the exhaust pipe of FIG. 4.

Accordingly, the protection structure 500 has an "L" shape, as illustrated in FIG. 5, where a predetermined volume of space S is formed between an inner area 521 of the second bent portion 520 and the surface of the chassis base 220. Here, the width of the space S should be sufficient to accommodate the exhaust pipe 213 protruded in a z-direction from the surface of the rear panel 212. That is, the surface of the rear panel 212 contacts and is joined to the chassis base 220 with the heat conduction medium 230 interposed between, and a hole 221 is formed in the chassis base 220 corresponding to the area where the exhaust pipe 213 is formed. The exhaust pipe 213 protrudes through the hole 221 of the chassis base 220, and the space S formed in protection structure 500 is large enough to accommodate the exhaust pipe 213.

A hole 530 with a predetermined diameter is formed in the second bent portion 520. The hole 530 is used to check the location of the exhaust pipe 213 during the fabrication process, and depending on the circumstances, to prevent damage to the exhaust pipe 213 due to interference between the end of the exhaust pipe 213 and the second bent portion 520.

Thus, the horizontal and vertical reinforcement members 410 and 420 are adhered to the back of the chassis base 220, and the protection structure 500 is formed in a single body with the reinforcement structure 400 that is aligned with the exhaust pipe 213. Protection structure 500 can be formed as part of either the horizontal or vertical reinforcement member, by bending to protect the end of the exhaust pipe 213. Therefore, while supplementing the bending strength of the chassis base 220, the exhaust pipe 213 can be protected without adding an additional member.

As described above, a PDP assembly according to an embodiment of the present invention includes a chassis base mounted on the back of a panel assembly. At least one reinforcement structure is mounted on the chassis base to supplement the strength of the chassis base against a bending force and torque applied to the top, bottom, left side, and right side of the large-size panel assembly. A protection structure is formed as a single body with the reinforcement structure to safeguard the end of an exhaust pipe required during the fabrication process of the panel assembly. The following effects can be achieved by having this structure:

First, production costs are lowered since a separate additional structure is not required because the protection structure is formed as a single body with the reinforcement structure. Second, because the protection structure is bent, damage to the exhaust pipe can be prevented by accommodating the exhaust pipe in the space enclosed by the protection structure. Third, a production process is simplified since the exhaust pipe is protected and the strength of the structure is increased at the same time because the protection structure is formed as a single body with the reinforcement structure. Fourth, interference between the exhaust pipe and the protection structure can be prevented even if there is an error on a location of the exhaust pipe or the height of the exhaust pipe because a predetermined hole is formed in the protection structure for alignment with the exhaust pipe. Fifth, the strength of the chassis base is fortified because the reinforcement structure is adhered to the top, bottom, left and right sides on the back of the chassis base.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A plasma display panel (PDP) assembly, comprising:

a panel assembly comprising an exhaust pipe protruding therefrom;

a chassis base supporting the panel assembly;

a reinforcement structure mounted on the chassis base and adapted to fortify a strength of the chassis base toward the panel assembly; and a protection structure adapted to shelter an end of the exhaust pipe, the protection structure being formed as part of the reinforcement structure.

2. The PDP assembly of claim 1, wherein the reinforcement structure is arranged behind the chassis base and is adhered to at least one of a top, a bottom, a left side, and a right side of the chassis base horizontally or vertically.

3. The PDP assembly of claim 1, wherein the exhaust pipe protrudes toward the reinforcement structure by passing through a hole formed in the chassis base.

4. The PDP assembly of claim 1, wherein the protection structure encloses a space to make possible to accommodate the exhaust pipe with one end of the reinforcement structure that coincides with the location of the exhaust pipe.

5. The PDP assembly of claim 4, wherein the protection structure comprises a first bent portion bent from one end of the reinforcement structure away from the panel assembly, and a second bent portion bent from the first bent portion such that the first and second bent portions enclose a space large enough to encompass the exhaust pipe.

6. The PDP assembly of claim 5, wherein the protection structure has an L-shape bend from a portion of the reinforcement structure that is in contact with the chassis base.

7. The PDP assembly of claim 1, the reinforcement structure and the protection structure being a single integrated monolithic unit.

8. A plasma display panel (PDP) assembly, comprising:

a panel assembly comprising an exhaust pipe protruding therefrom;

a chassis base supporting the panel assembly;

a reinforcement structure mounted on the chassis base and adapted to fortify a strength of the chassis base toward the panel assembly; and a protection structure adapted to shelter an end of the exhaust pipe, the protection structure being formed as part of the reinforcement structure, wherein the protection structure encloses a space to make possible to accommodate the exhaust pipe with one end of the reinforcement structure that coincides with the location of the exhaust pipe, wherein the protection structure comprises a first bent portion bent from one end of the reinforcement structure away from the panel assembly, and a second bent portion bent from the first bent portion such that the first and second bent portions enclose a space large enough to encompass the exhaust pipe, and wherein the second bent portion is perforated by a hole adapted to align with a location of the exhaust pipe.

9. A PDP assembly, comprising:

an exhaust pipe protruded from a panel assembly;

a chassis base mounted on one side of the panel assembly and arranged to support the panel assembly such that the exhaust pipe protrudes through a hole formed in the chassis base;

a reinforcement structure arranged on at least one of a top, bottom, a left side, and a right side of the chassis base and behind the chassis base adapted to fortify the chassis base; and a protection structure arranged as a single body with the reinforcement structure and enclosing a space accommodating an end of the exhaust pipe, the protection structure being formed at an end of the reinforcement structure and at a location where the exhaust pipe is placed.

10. The PDP assembly of claim 9, wherein the protection structure is bent at least once from a portion of the reinforcement structure that is in contact with the chassis base to accommodate the end of the exhaust pipe.

11. The PDP assembly of claim 9, the protection structure is bent twice forming a first bent portion between a first bent area and a second bent area, and a second bent portion as a tab adjacent to a second bent area, the first bent portion being parallel to the exhaust pipe and the second bent portion being parallel to the chassis base.

12. A PDP assembly, comprising:

an exhaust pipe protruded from a panel assembly;

a chassis base mounted on one side of the panel assembly and arranged to support the panel assembly such that the exhaust pipe protrudes through a hole formed in the chassis base;

a reinforcement structure arranged on at least one of a top, bottom, a left side, and a right side of the chassis base and behind the chassis base adapted to fortify the chassis base; and a protection structure arranged as a single body with the reinforcement structure and enclosing a space accommodating an end of the exhaust pipe, the protection structure being formed at an end of the reinforcement structure and at a location where the exhaust pipe is placed, wherein the protection structure is bent at least once from a portion of the reinforcement structure that is in contact with the chassis base to accommodate the end of the exhaust pipe, wherein a space that accommodates the end of the exhaust pipe exists between the bent portion of the protection structure and the chassis base.

13. A PDP assembly, comprising:

a PDP panel comprising transparent substrates, electrodes and phosphor layers;

an exhaust pipe protruding perpendicularly from the PDP panel towards a back of the PDP assembly;

a chassis base formed on a back side of the PDP panel; and a reinforcement structure formed on a back side of the PDP panel and adapted to prevent torque and bending of the PDP panel, the reinforcement structure comprising a protection structure adapted to protect the exhaust pipe from damage.

14. The PDP assembly of claim 13, the reinforcement structure extending across the PDP panel.

15. The PDP assembly of claim 13, the protection structure and the reinforcement structure both being made out of the same material and both forming a single integrated monolithic unit.

16. The PDP assembly of claim 13, the protection structure having one bend.

17. The PDP of claim 13, the chassis base being perforated by a hole, said exhaust pipe runs through said hole.

18. The PDP assembly of claim 13, the PDP panel including a front substrate and a rear substrate, the electrodes and the phosphor layers being arranged between the front substrate and the rear substrate, the chassis base being mounted on a back side of the rear substrate, the exhaust pipe protruding from a back side of the rear substrate, a plurality of circuit devices being arranged on a back side of the chassis base, the reinforcement structure and the protection structure also being arranged on the back side of the chassis base.

19. A PDP assembly, comprising:

a PDP panel comprising transparent substrates, electrodes and phosphor layers;

an exhaust pipe protruding perpendicularly from the PDP panel towards a back of the PDP assembly;

a chassis base formed on a back side of the PDP panel; and and a reinforcement structure formed on a back side of the PDP panel and adapted to prevent torque and bending of the PDP panel, the reinforcement structure comprising a protection structure adapted to protect the exhaust pipe from damage, the protection structure is bent twice forming a first bent portion between a first bent area and a second bent area, and a second bent portion as a tab adjacent to the second bent area, the tab being perforated by a hole.

20. The PDP assembly of claim 19, the hole in the tab being aligned with the exhaust pipe.

21. The PDP of claim 20, the chassis base being perforated by a hole, said exhaust pipe runs through said hole in said chassis base.

* * * * *